United States Patent [19]

Tomita et al.

[11] Patent Number: 5,763,889
[45] Date of Patent: Jun. 9, 1998

[54] ELECTRON BEAM-GENERATING APPARATUS

[75] Inventors: Takeshi Tomita; Shoji Kato; Atsushi Kimura, all of Tokyo, Japan

[73] Assignee: JEOL Ltd., Tokyo, Japan

[21] Appl. No.: 821,986

[22] Filed: Mar. 21, 1997

[30] Foreign Application Priority Data

Mar. 22, 1996  [JP]  Japan .................... 8-065929

[51] Int. Cl.⁶ ............................................ H01J 37/065
[52] U.S. Cl. ............................................ 250/396 R
[58] Field of Search ............................... 250/396 R

[56] References Cited

U.S. PATENT DOCUMENTS

| | | | |
|---|---|---|---|
| 3,927,321 | 12/1975 | Welter | 250/396 R |
| 4,798,957 | 1/1989 | Tolner | 250/396 R |
| 5,241,182 | 8/1993 | Martin et al. | 250/396 R |

OTHER PUBLICATIONS

"Computerized Electron–Beam Linewidth Measuring and Inspection: A New Tool", Tom F. Pomposo and Vincent J. Coates. *Silicon Processing*, pp. 501–508.

*Primary Examiner*—Jack I. Berman
*Attorney, Agent, or Firm*—Webb Ziesenheim Bruening Logsdon Orkin & Hanson, P.C.

[57] ABSTRACT

There is disclosed an apparatus for generating an electron beam in an electron microscope comprising an electron gun, a second anode located under the gun, an aperture plate having an aperture for limiting the electron beam, and a scattered electron-blocking member for limiting passage of the beam. The aperture plate is mounted in the beam passage formed in the second anode. The scattered electron-blocking member is located under the aperture plate. Electrons scattered at the edges of the aperture are blocked by the scattered electron-blocking member from colliding against the accelerator tube.

9 Claims, 3 Drawing Sheets

ELECTRON BEAM-GENERATING APPARATUS

BACKGROUND OF THE INVENTION

1. Field of the Invention

The present invention relates to an apparatus for generating electrons in an electron microscope or the like.

2. Background FIG. 3 depicts the prior art electron beam-generating apparatus used in an electron microscope. This apparatus is shown to have an electron gun and an accelerator tube. A mount 101 is fixedly attached to the inner wall of the microscope column (not shown) of the electron microscope. An annular base plate 102 is fixedly mounted to the mount 101. A bellows 103 is held to the underside of the base plate 102. The bottom end of a cylindrical member 106 is joined to the top end of an electron gun support member 104 made of a ceramic insulator. The cylindrical member 106 has an upper portion extending upwardly through both bellows 103 and annular base plate 102. An external thread 106a is formed at the top of the cylindrical member 106. An annular position-adjusting plate 107 has an internal thread 107b which is in mesh with the external thread 106a. That is, the electron gun support member 104, cylindrical member 106, and position-adjusting plate 107 are coupled together. Feeder cables 108, 109, etc. pass through the annular position-adjusting plate 107 and through the cylindrical member 106. A cap 111 is fixedly mounted to the top surface of the position-adjusting plate 107 to make the feeder cables 108, 109, etc. stationary.

The position-adjusting plate 107 is provided with a plurality of bolt-through holes (not shown). Plural connecting bolts 112 extend through these bolt-through holes (not shown) to securely mount the plate 107 to the base plate 102. Since the inside diameter of the bolt-through holes (not shown) is slightly larger than the outside diameter of the connecting bolts 112, the position of the position-adjusting plate 107 on the top surface of the base plate 102 is adjustable.

Four position-adjusting, tilted surfaces 107a which are circumferentially spaced from each other by 90° are formed on the outer surface of the position-adjusting plate 107. Position-adjusting members 116 having tilted surfaces 116a are held to position-adjusting bolts 114 so as to be capable of rotating but incapable of moving axially. These bolts 114 are in mesh with the base plate 102. The tilted surfaces 116a of the position-adjusting members 116 bear against the position-adjusting, tilted surfaces 107a, respectively.

Accordingly, when the connecting bolts 112 are loosened, the position-adjusting plate 107 can move on the base plate 102. If one of the position-adjusting bolts 114 is rotated and the tilted surfaces 116a of the position-adjusting members 116 are pressed against the position-adjusting, tilted surfaces 107a of the position-adjusting plate 107, the position of the position-adjusting plate 107 is moved on the top surface of the base plate 102. Thus, the position is adjusted. The position-adjusting plate 107 is placed in position on the base plate 102 by bringing the tilted surfaces 116a of the position-adjusting members 116 into abutment with the four position-adjusting, tilted surfaces 107a, respectively.

After the position-adjusting plate 107 has been placed in position as mentioned above, the cylindrical member 106 and the electron gun support member 104 coupled to the position-adjusting plate 107 are placed in position and locked.

An electron gun 117 is held to the bottom end of the electron gun support member 104. The electron gun 117 is composed of an emitter portion 118 and a first anode 119 that acts as an extraction anode. The emitter portion 118 includes a suppressor electrode. The first anode 119 has a detachable electron beam passage portion 119a. Electric power is supplied to the emitter portion 118 and to the first anode 119 through the feeder cables 108 and 109.

A second anode 121 acting as an electrostatic lens is located below the electron gun 117 and provided with an electron passage hole. The second anode 121 is composed of an upper anode portion 122 and a lower anode portion 123. An aperture plate 124 is mounted between these two anode portions 122 and 123. The aperture plate 124 is centrally provided with an aperture 124a to limit the electron beam. A second anode member 126 is formed by the second anode 121 and aperture plate 124.

A third anode 127 and an accelerator tube 128 are disposed below the second anode member 126. The accelerator tube 128 has accelerating anodes 128a, 128b, etc. (only a part of 128a is shown).

The second anode 121 serves as an electrostatic lens acting on the electrons emitted from the emitter portion of the electron gun of the electron microscope constructed as described above. The second anode 121 has the aperture 124a to prevent unwanted electrons from entering the accelerator tube and downstream microscope column portions. Scattered electrons are produced at the edges of the aperture 124a and collide against the accelerator tube located under the second anode, thus sputtering the surfaces of the accelerating anodes of the accelerator tube and the surfaces of the ceramic insulator and other parts. As a result, charging effects, outgassing, ionization of produced gases, and other phenomena take place. These cause microdischarges in the accelerator tube.

In the prior art electron beam-generating apparatus described above, the second anode 121 acting as an electrostatic lens is formed independent of the electron gun. The aperture plate 124 having the small electron passage hole is held to this second anode 121. In this case, a mechanism for aligning the axis of the electron gun with the axis of the second anode is necessary to permit the electron beam emitted from the electron gun 117 to pass through the aperture 124a. Furthermore, this alignment operation is cumbersome to perform.

SUMMARY OF THE INVENTION

In view of the foregoing problems, the present invention has been made. It is an object of the present invention to provide an electron beam-generating apparatus which is for use in an instrument having an accelerator tube and an aperture plate and is capable of preventing scattered electrons produced at the edges of the aperture from colliding against the accelerator tube.

It is another object of the invention to provide an electron beam-generating apparatus which dispenses with axial alignment of the electron gun and the second anode.

An electron beam-generating apparatus, in accordance with the present invention, achieves these objects and comprises: an electron gun having an emitter and a first anode for extracting electrons from the emitter; a second anode having an electron passage hole and located under the electron gun; an aperture plate having an aperture for limiting passage of an electron beam formed by the extracted electrons, said aperture plate being mounted in the electron passage hole; and a scattered electron-blocking member having an electron beam-limiting hole for limiting passage of the electron beam. The scattered electron-blocking member is mounted in the electron passage hole formed in the second anode.

Another electron beam-generating apparatus, in accordance with the present invention, comprises: an electron gun having an emitter and a first anode for extracting electrons from the emitter; a second anode having an electron passage hole and located under the electron gun; and an aperture plate having an aperture for limiting passage of an electron beam. The aperture plate is mounted in the electron passage hole. This apparatus is characterized in that the electron gun and the second anode are coupled together to form a subassembly.

A complete understanding of the invention will be obtained from the following description when taken in connection with the accompanying drawing figures wherein like reference characters identify like parts throughout.

DESCRIPTION OF THE PREFERRED EMBODIMENTS

Figure 1:
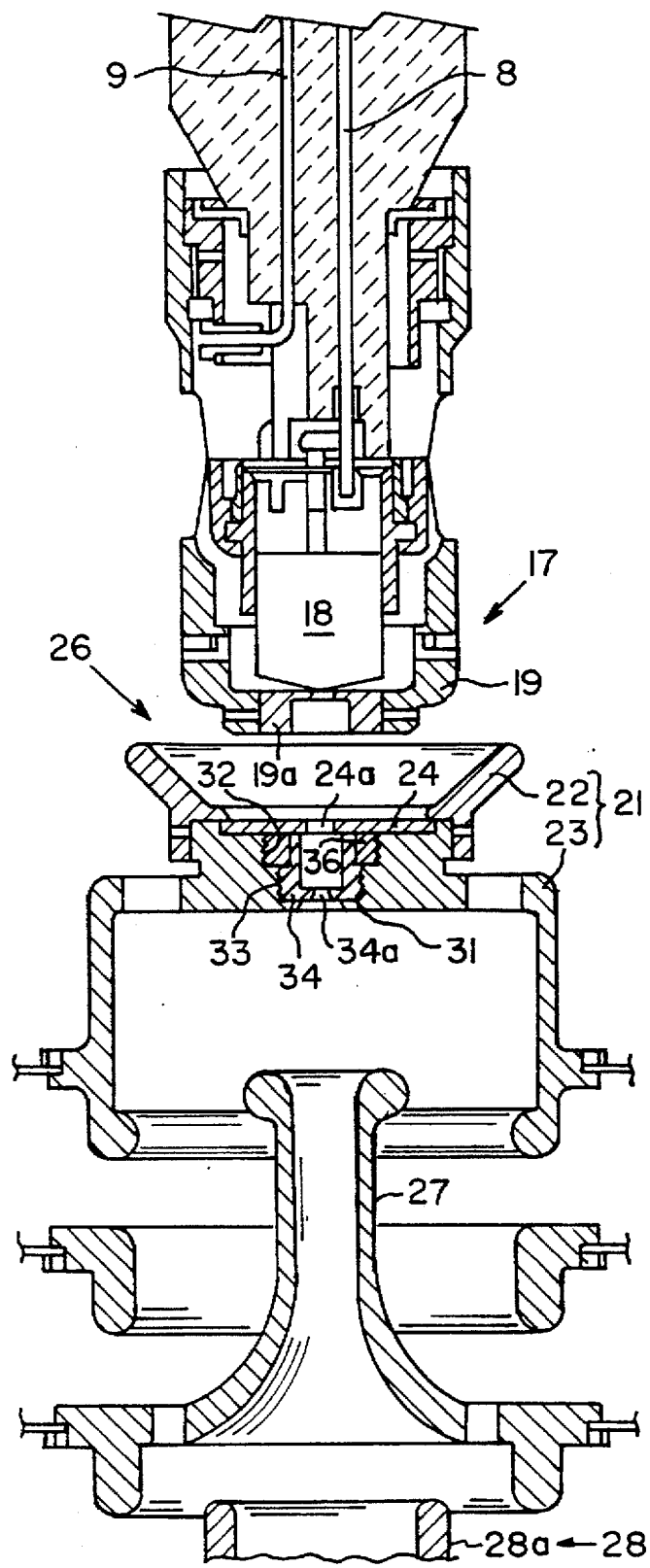
FIG. 1 is a cross-sectional view of an instrument incorporating an electron beam-generating apparatus in accordance with the invention showing its electron gun and accelerator tube.
Figure 3:
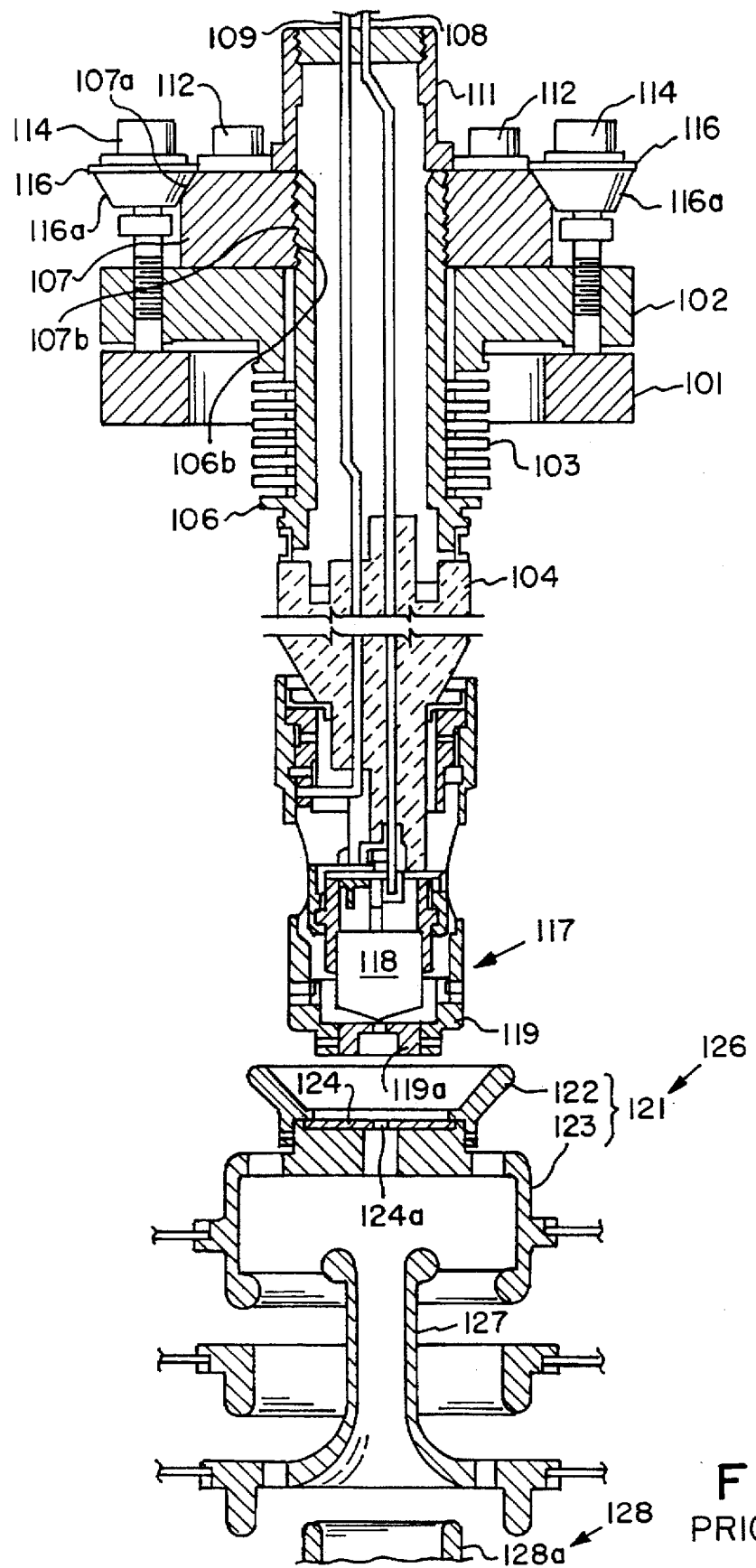
FIG. 3 is a cross-sectional view similar to FIGS. 1 and 2 but showing the prior art electron beam-generating apparatus.

Referring to FIG. 1, there is shown an electron microscope having an electron gun and an accelerator tube. An electron beam-generating apparatus, in accordance with the present invention, is incorporated in this microscope. It is to be noted that those components shown in FIG. 3 which are similar to their counterparts of FIG. 1 are indicated by the same reference numerals as used in FIG. 1 but are 100 numbers greater. The electron gun and the accelerator tube are similar in structure with the prior art electron gun and accelerator tube shown in FIG. 3 in that a second anode 21 is composed of an upper anode portion 22 and a lower anode portion 23, and that an aperture plate 24 having an aperture 24a is located between these two anode portions 22 and 23.

Referring again to FIG. 1, a block-receiving hole 31 is formed in the top surface of the lower anode portion 23 of the second anode 21. The upper half of this hole 31 is made to have a large diameter, while the lower half is made to have a smaller diameter. An internal thread 32 of a larger diameter and an external thread 33 of a smaller diameter are respectively formed in the inner walls of these two halves of the hole 31. A scattered electron-blocking member 34 consisting of a cylinder having a bottom is meshed and connected with the external thread 33. An electron beam-limiting hole 34a having a diameter of 1.5 mm is formed at the bottom of the scattered electron-blocking member 34. This scattered electron-blocking member 34 has a reduced upper portion on its outer surface and an enlarged portion under the reduced upper portion. A locking cylindrical screw member 36 having an external thread in mesh with the internal thread 32 is located between the reduced upper portion of the scattered electron-blocking member 34 and the internal thread 32. The bottom end of the screw member 36 pushes the boundary between the reduced and enlarged portions of the electron-blocking member 34 downward. Thus, the scattered electron-blocking member 34 is firmly secured to the lower anode portion 23 of the second anode. In this embodiment, a second anode member 26 is formed by the second anode 21 and the components 31–36.

Since the second anode member 26 of the construction described above has the aforementioned scattered electron-blocking member 34, the electron beam passing through the second anode member 26 passes through the electron beam-limiting hole 34a of a smaller diameter. Electrons scattered at the edges of the aperture 24a are intercepted by the scattered electron-blocking member 34 and thus are prevented from colliding against a third anode member 27 and accelerating anodes 28a, 28b, etc. of the accelerator tube 28 located under the third anode member 27; otherwise, release of gases and microdischarges would be induced.

Figure 2:
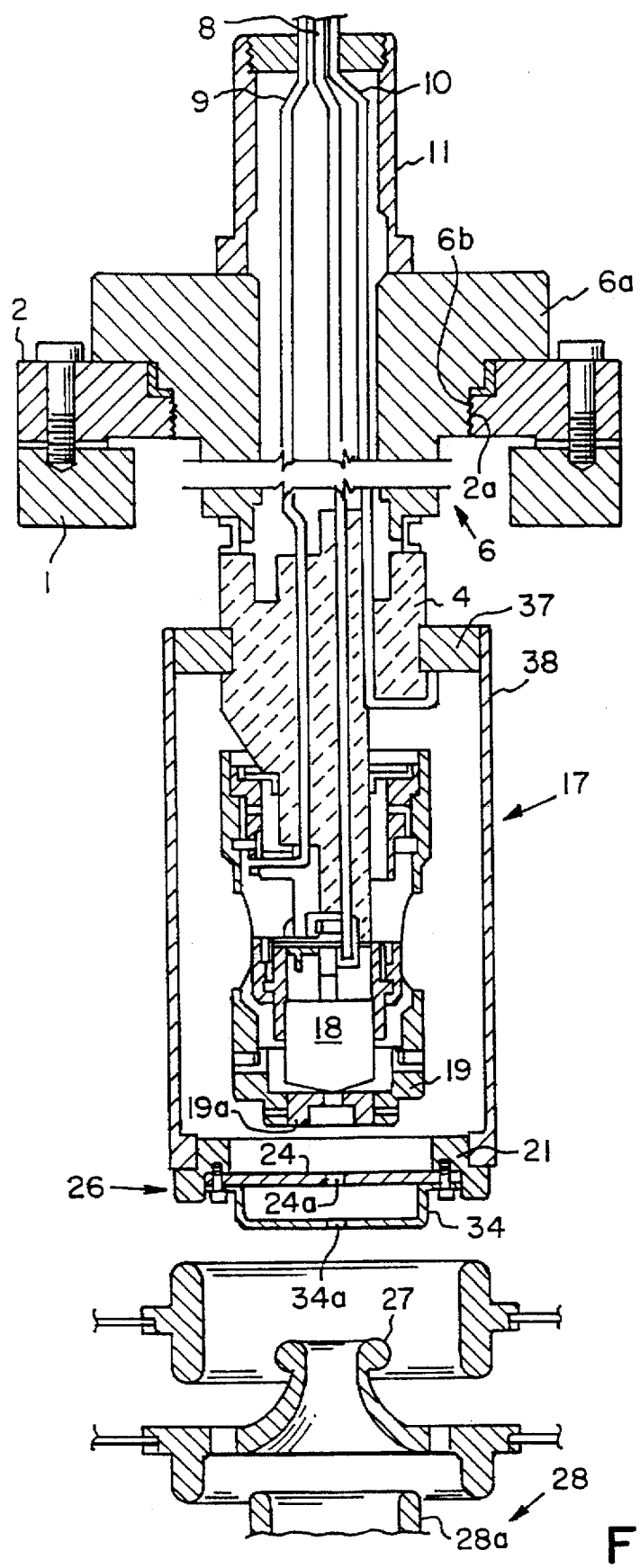
FIG. 2 is a cross-sectional view similar to FIG. 1 but showing another electron beam-generating apparatus in accordance with the invention.

Referring next to FIG. 2, there is shown an electron microscope having another electron beam-generating apparatus in accordance with the present invention, as well as the electron gun and accelerator tube of the electroscope. The electron gun and accelerator tube are similar to their counterparts shown in FIG. 2 except for some points described later.

In FIG. 2, an annular base plate 2 is affixedly mounted to a mount 1. A cylindrical member 6 has a flange 6a at its top end. The bottom end of this cylindrical member 6 is coupled to the top end of an electron gun support member 4 made of a ceramic insulator. The cylindrical member 6 and the base plate 2 are coupled together by meshing external threads 6b with internal threads 2a. The flange 6a at the top of the cylindrical member 6 is supported on the top surface of the base plate 2.

Feeder cables 8, 9, 10, etc. pass through the cylindrical member 6. A cap 11 is firmly secured to the top surface of the cylindrical member 6 to make the feeder cables 8, 9, 10, etc. stationary.

An aperture plate 24 having an aperture 24a and a scattered electron-blocking member 34 having an electron beam-limiting hole 34a are held to the second anode 21. The second anode member 26 of this second embodiment is constituted by the second anode 21, aperture plate 24, and scattered electron-blocking member 34.

The second anode member 26 is held by a conductive annular member 37 and also by a conductive cylindrical member 38 that is supported to the annular member 37. The conductive annular member 37 is held to the electron gun support member 4. Electric power is fed to the annular member 37 through the feeder cable 10.

Since the second anode member 26 of the above-described construction is supported to the electron gun support member 4 by the annular member 37 and cylindrical member 38, the electron gun 17 and the second anode 21 can be secured in an aligned relation to each other. In consequence, the electron beam emitted from the electron gun 17 can be made to pass through the small aperture 24a in the aperture plate 24 without the necessity of axial alignment.

The second anode member 26 has the scattered electron-blocking member 34 in the same way as in the first-mentioned embodiment. Therefore, the electron beam passing through the second anode member 26 passes through the small electron beam-limiting hole 34a. Electrons scattered at the edges of the aperture 24a are blocked by the scattered electron-blocking member 34 and thus are prevented from colliding against a third anode member 27 and accelerating anodes 28a, etc. of the accelerator tube 28 located under the third anode member 27; otherwise, release of gases and microdischarges would be induced.

While preferred embodiments of the invention have been described using specific terms, such description is for illustrative purposes only, and it is to be understood that changes and variations may be made without departing from the spirit or scope of the following claims. For example, in the second embodiment, the scattered electron-blocking member 34 is mounted to the second anode 21. The scattered electron-blocking member 34 may be omitted. Furthermore, the scattered electron-blocking member 34 may be located alone under the second anode 21 without attaching the scattered electron-blocking member 34 to the second anode 21.

Having thus described our invention with the detail and particularity required by the Patent Laws, what is desired protected by Letters Patent is set forth in the following claims.

What is claimed is:

1. An electron beam-generating apparatus comprising:

an electron gun having an emitter and a first anode for extracting electrons from said emitter;

a second anode having an electron passage hole and located under said electron gun;

an aperture plate having an aperture for limiting passage of an electron beam created by said extracted electrons, said aperture plate being mounted in said electron passage hole; and a scattered electron-blocking member having an electron beam-limiting hole for limiting passage of said electron beam, said scattered electron-blocking member being mounted in said electron passage hole formed in said second anode.

2. The electron beam-generating apparatus of claim 1, wherein said aperture plate is detachably mounted to said second anode.

3. The electron beam-generating apparatus of claim 1, wherein said scattered electron-blocking member is detachably mounted to said second anode.

4. An electron beam-generating apparatus comprising:

an electron gun having an emitter and a first anode for extracting electrons from said emitter;

a second anode having an electron passage hole and located under said electron gun, said second anode being coupled to said electron gun; and an aperture plate having an aperture for limiting passage of an electron beam created by said extracted electrons.

5. The electron beam-generating apparatus of claim 4, wherein said electron gun is mounted to a mount and depends therefrom.

6. The electron beam-generating apparatus of claim 4, wherein said aperture plate is detachably mounted to said second anode.

7. The electron beam-generating apparatus of claim 4, wherein a scattered electron-blocking member having an electron beam-limiting hole for limiting passage of the electron beam is located under said aperture plate and mounted in said electron passage hole formed in said second anode.

8. The electron beam-generating apparatus of claim 7, wherein said electron gun is mounted to a mount and depends therefrom.

9. The electron beam-generating apparatus of claim 7, wherein said aperture plate is detachably mounted to said second anode.

* * * * *